United States Patent
Weng et al.

(10) Patent No.: US 6,956,253 B2
(45) Date of Patent: Oct. 18, 2005

(54) COLOR FILTER WITH RESIST MATERIAL IN SCRIBE LINES

(75) Inventors: Fu-Tien Weng, Hsin-Chu (TW); Yu-Kung Hsiao, Taoyuan (TW); Hung-Jen Hsu, Taoyuan (TW); Yi-Ming Dai, Hsin-Chu (TW); Chin-Chen Kuo, Taipei (TW); Te-Fu Tseng, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 10/456,759

(22) Filed: Jun. 6, 2003

(65) Prior Publication Data

US 2004/0248383 A1 Dec. 9, 2004

(51) Int. Cl.$^7$ .............................................. H01L 29/768
(52) U.S. Cl. ....................... 257/232; 257/233; 257/234; 438/70
(58) Field of Search ................................ 257/432–435, 257/232–240; 438/70, 71–75

(56) References Cited

U.S. PATENT DOCUMENTS

| | | | |
|---|---|---|---|
| 6,171,885 B1 | 1/2001 | Fan et al. ...................... 438/70 |
| 6,274,917 B1 | 8/2001 | Fan et al. .................... 257/432 |
| 6,395,576 B1 | 5/2002 | Chang et al. .................. 438/70 |
| 6,482,669 B1 | 11/2002 | Fan et al. ...................... 438/70 |
| 6,495,813 B1 | 12/2002 | Fan et al. ................. 250/208.1 |
| 6,582,988 B1 * | 6/2003 | Hsiao et al. ................... 438/70 |
| 6,632,700 B1 * | 10/2003 | Fan et al. ...................... 438/70 |

OTHER PUBLICATIONS

Press Release, Hsin–Chu, Taiwan—(Business Wire)—May 15, 2000—"TSMC begins volume production of CMOS image sensors" http://www.dpreview.com/news/0005/00051503tsmc_cmos.asp, 3 pages, visited Mar. 11, 2003.

* cited by examiner

*Primary Examiner*—Dung A. Le
(74) *Attorney, Agent, or Firm*—Duane Morris LLP; Steven E. Koffs

(57) ABSTRACT

A color filter includes a substrate having a plurality of scribe lines arranged to form at least one filter region surrounded by the scribe lines. The scribe lines are at least partially filled with a resist material. At least one color resist layer is formed above the substrate within the at least one filter region.

8 Claims, 5 Drawing Sheets

COLOR FILTER WITH RESIST MATERIAL IN SCRIBE LINES

FIELD OF THE INVENTION

The present invention relates to semiconductor devices generally, and more specifically to solid-state color filters.

BACKGROUND

Color filters suitable for use in color image sensors have been described in U.S. Pat. Nos. 6,171,885, 6,395,576, 6,274,917, 6,482,669 and 6,495,813, all of which are incorporated by reference herein in their entireties.

A color image sensor is typically a charge-coupled device (CCD) or complementary metal-oxide semiconductor (CMOS) photodiode array structure. The structure includes a spectrally photosensitive layer below one or more layers patterned in an array of color filters, above which resides a surface-layer array of microlens elements. In some conventional configurations, a color pixel is formed using four adjacent pixels on an image sensor. Each of the four pixels is covered by a different color filter selected from the group of red, blue and two green pixels, thereby exposing each monochromatic pixel to only one of the three basic colors. Simple algorithms are subsequently applied to merge the inputs from the three monochromatic pixels to form one full color pixel.

If the color filter signal deviation is too large, CMOS image sensor performance may be affected, resulting in yield loss as high as 15 to 20%. For example, the inventors of this application are aware of product samples in which the observed color signal standard deviations were: blue 3.93%, green 2.84% and red 1.68%. This corresponds to a yield measure Cpk of lower than 0.5.

The color filter deposition process and its relationship to the microlens array formation process are known to influence the production cycle-time, test-time, yield, and ultimate manufacturing cost.

A method of making a color filter with less signal deviation and improved yield is desired.

SUMMARY OF THE INVENTION

A method for processing a semiconductor substrate comprises the steps of: providing a substrate having a plurality of scribe lines having a step height and arranged to form at least one filter region surrounded by the scribe lines, at least partially filling the scribe lines with a resist material to reduce the step height of the scribe lines, and forming at least one color resist layer within the at least one filter region while the insoluble resist material remains in the scribe lines.

A color filter comprises a substrate having a plurality of scribe lines arranged to form at least one filter region surrounded by the scribe lines, the scribe lines at least partially filled with a resist material; and at least one color resist layer formed above the substrate within the at least one filter region.

DETAILED DESCRIPTION

Figure 1:
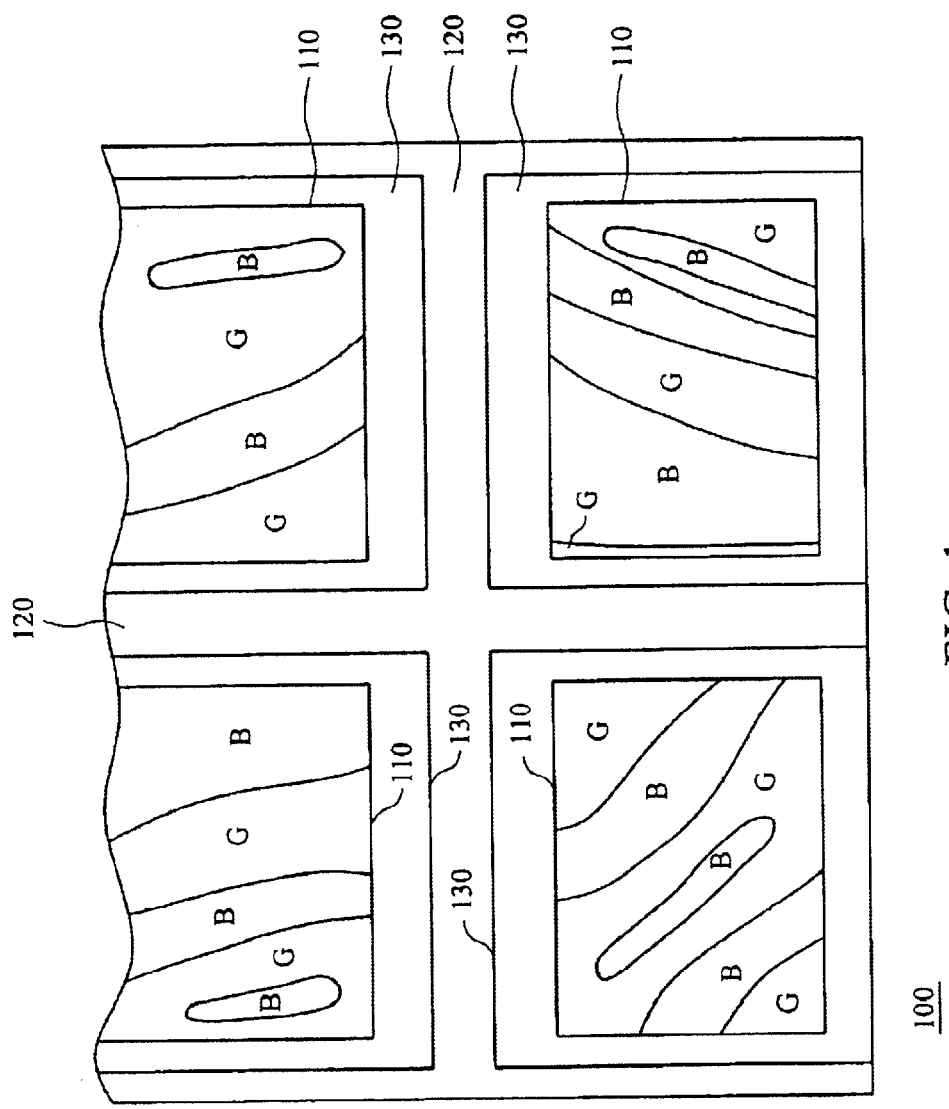
FIG. 1 is a plan view showing a plurality of color filter active regions that exhibit the stripe defect.

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly,"etc.) should be construed to refer to the orientation as then described or as shown in the drawing under discussion. These relative terms are for convenience of description and do not require that the apparatus be constructed or operated in a particular orientation.

The inventors have determined that a major factor in causing color signal deviation in color filters is a problem referred to herein as the "stripe defect." The stripe defect refers to a condition in which the thickness of the color resist layers is not uniform within and/or between pixels. This is especially a problem with blue and green color resist layers. When the active region is viewed from above, these non-uniform color resist layers appear to have blue and green stripes or irregular regions. A portion of a CMOS image sensor (CIS) is shown in FIG. 1. The sensor 100 includes a plurality of scribe lines 120 arranged in a rectangular array. A plurality of filter regions are surrounded by the scribe lines 120. The filter regions include active regions 110 and bond pad regions 130 arranged within the scribe lines 120. The stripe defect is indicated by the plurality of regions designated "B", in which either the blue resist layer is thicker than its nominal value, or the green resist layer is thinner than its nominal value, and a plurality of regions designated "G", in which either the green resist layer is thicker than its nominal value, or the blue resist layer is thinner than its nominal value.

The inventors have determined that the stripe defect is caused by serious front end topography issues. That is, the front end of the processing flow leaves an uneven surface on the semiconductor substrate on which the color filters are formed. This uneven surface degrades the ability to deposit planar layers above it.

The inventors have further determined that the deeper the step height of the scribe lines in the substrate, the more serious the stripe defect becomes. A secondary factor is the photoresist coating speed; higher coating speeds increase the stripe defect. However, the scribe line step height is the major cause of the stripe defect.

Figure 2:
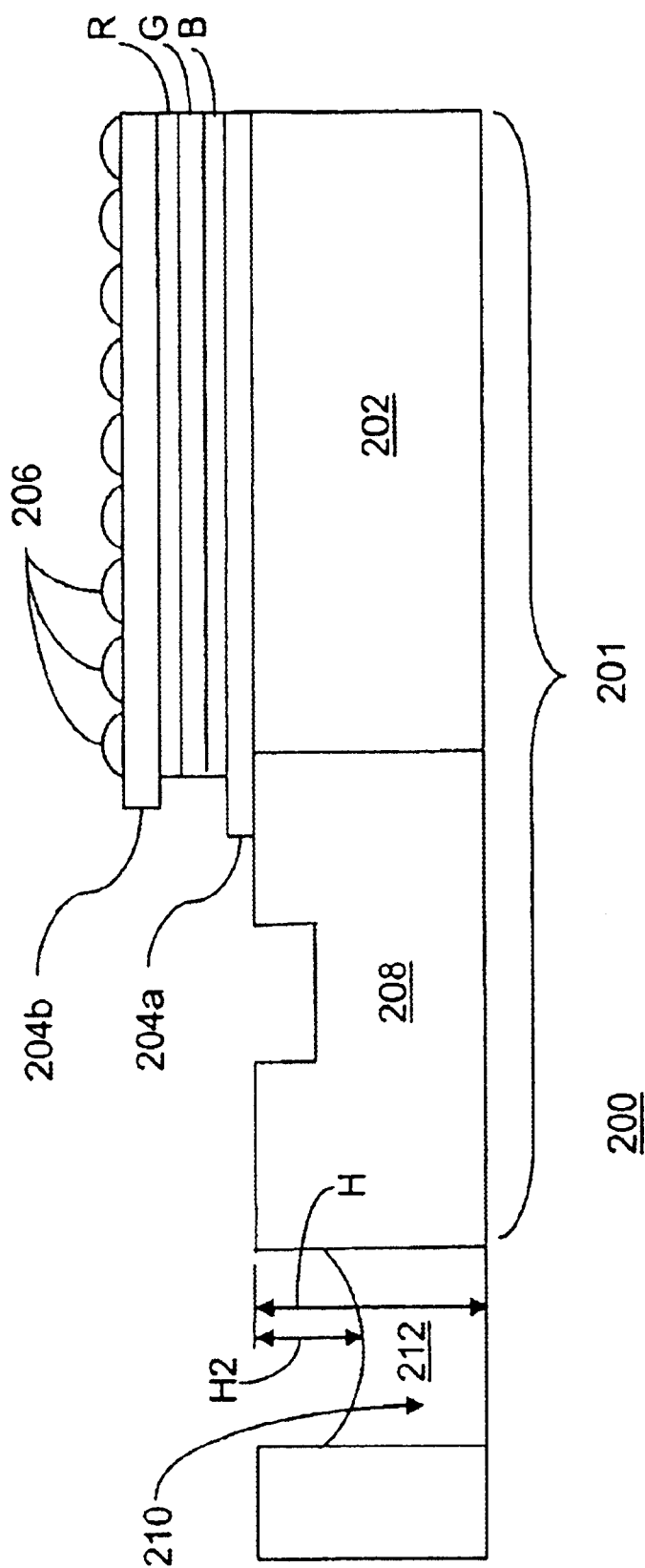
FIG. 2 is a cross sectional view showing an active region of a color filter formed using an exemplary method.

FIG. 2 is a cross-sectional view of an exemplary color filter device 200. The device 200 has a substrate having a plurality of scribe lines 210 arranged to form at least one filter region 201 surrounded by the scribe lines. In a wafer having many filter regions 201, the plurality of scribe lines 210 form a grid of perpendicular lines. The filter region 201 includes an active region 202 and a bond pad region 208 with bond pads 209 thereon. The active region 202 has a planarization layer 204a formed thereon, which may be a resist layer thicker than the height of the steps on the wafer surface. Planarization layer 204a can be cast on the wafer and can be planarized by, for example, a free viscous flow of the resist at an elevated baking temperature or by a forced resist flow through pressing a flat mold on the resist surface while heating.

Above the first planarization layer 204a, blue, green and red color resist layers are formed, designated B, G and R, respectively. A second planar layer 204b is above the red layer R. A microlens layer 206 is formed above the second planar layer 204b.

The scribe lines 210 initially have a step height H. The step height H depends on the type of integrated circuit (IC) technology. For example, a 0.6 μm CMOS image sensor has a scribe line step height H of 3.33 μm. A 0.35 μm CMOS image sensor has a scribe line step height H of 4.55 μm. A 0.25 μm CMOS image sensor has a scribe line step height H deeper than 4.55 μm. Other IC technologies will have corresponding step heights H which may differ from these.

In the exemplary embodiments, the step of depositing the planarization layer 204a is modified to include at least partially filling the scribe lines 210 with a resist material 212 to reduce the step height of the scribe lines to H2 (where the step height H2 after the partial filling is the distance between the surface of the resist and the surface of the substrate). By at least partially filling the scribe line with resist, the uneven topography is reduced or eliminated, allowing uniform formation of the color resist layers B, G and R.

In FIG. 2, the resist 212 is only deposited inside the scribe line 210 to partially fill the scribe line. In some embodiments, the at least partial filling of the scribe line with resist is completed with the top of the resist below the surface of the substrate (i.e., with a positive step height remaining). In other embodiments, the scribe line 210 is completely filled, as described further below.

Figure 3:
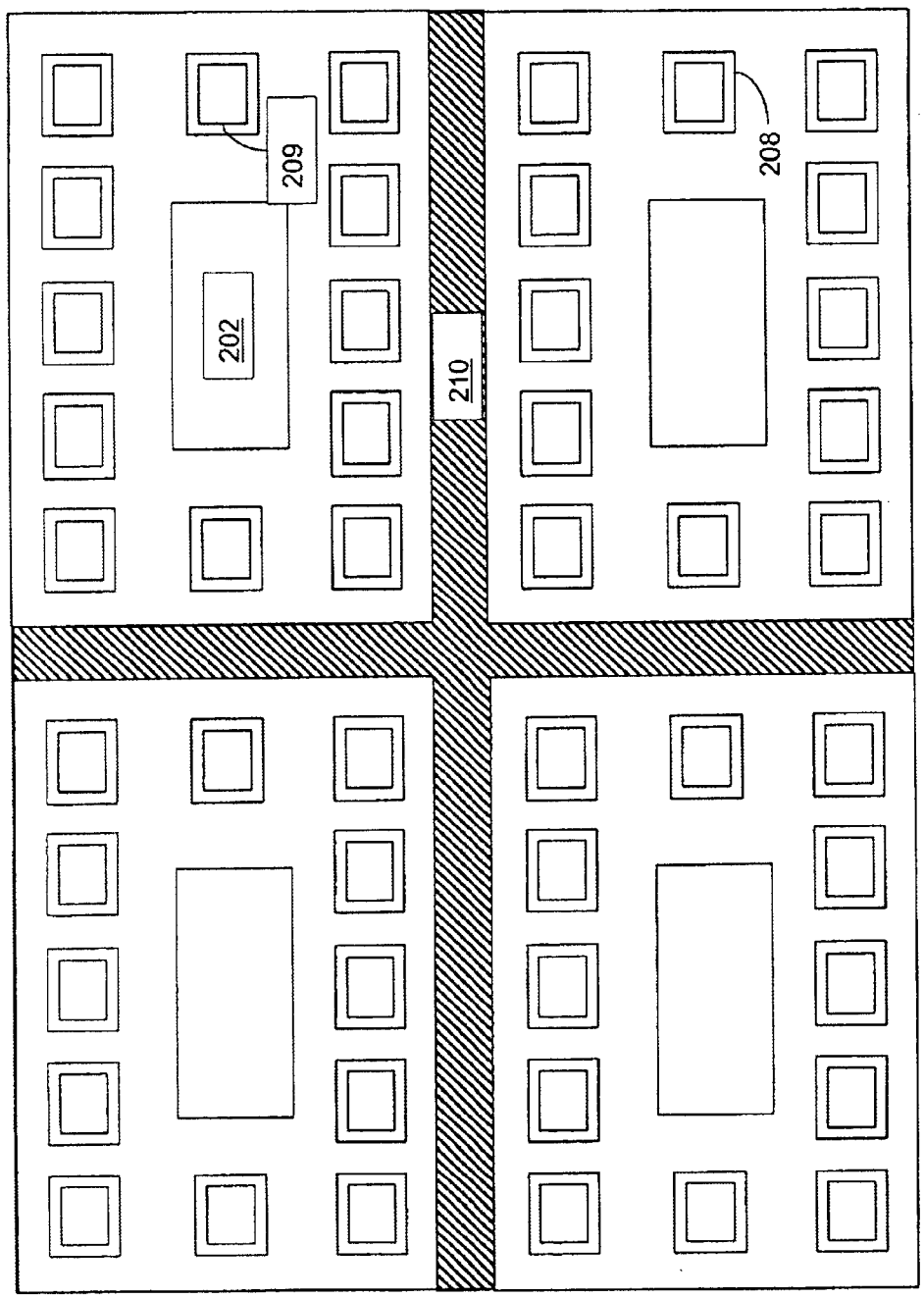
FIG. 3 is a plan view of a mask over the substrate shown in FIG. 2.

FIG. 3 shows an example of a mask that can be used to deposit the resist 212 in FIG. 2. In some embodiments, the mask is clear in the scribe lines 210 and dark outside of the scribe lines (for a negative resist). The resist in the scribe line regions becomes insoluble (hardened) upon exposure to the radiation, and the resist outside of the scribe lines remains soluble, for removal.

In other embodiments, the mask pattern is reversed, and the mask causes a positive photoresist outside the scribe line region to become soluble, in order keep resist in the scribe line 210 only. The mask is clear outside of the scribe lines and dark inside the scribe lines (for a positive resist). The resist inside the scribe lines remains insoluble and is kept.

In some embodiments, a chemical solution is applied to dissolve and remove the soluble portion of the resist outside the scribe lines 210. In other embodiments, dry plasma etch is used, where ions energized by a plasma field hit the portion of resist layer outside the scribe lines 210 and chemically dissolve it. The resist 212 remains in the scribe lines 210.

Figure 4:
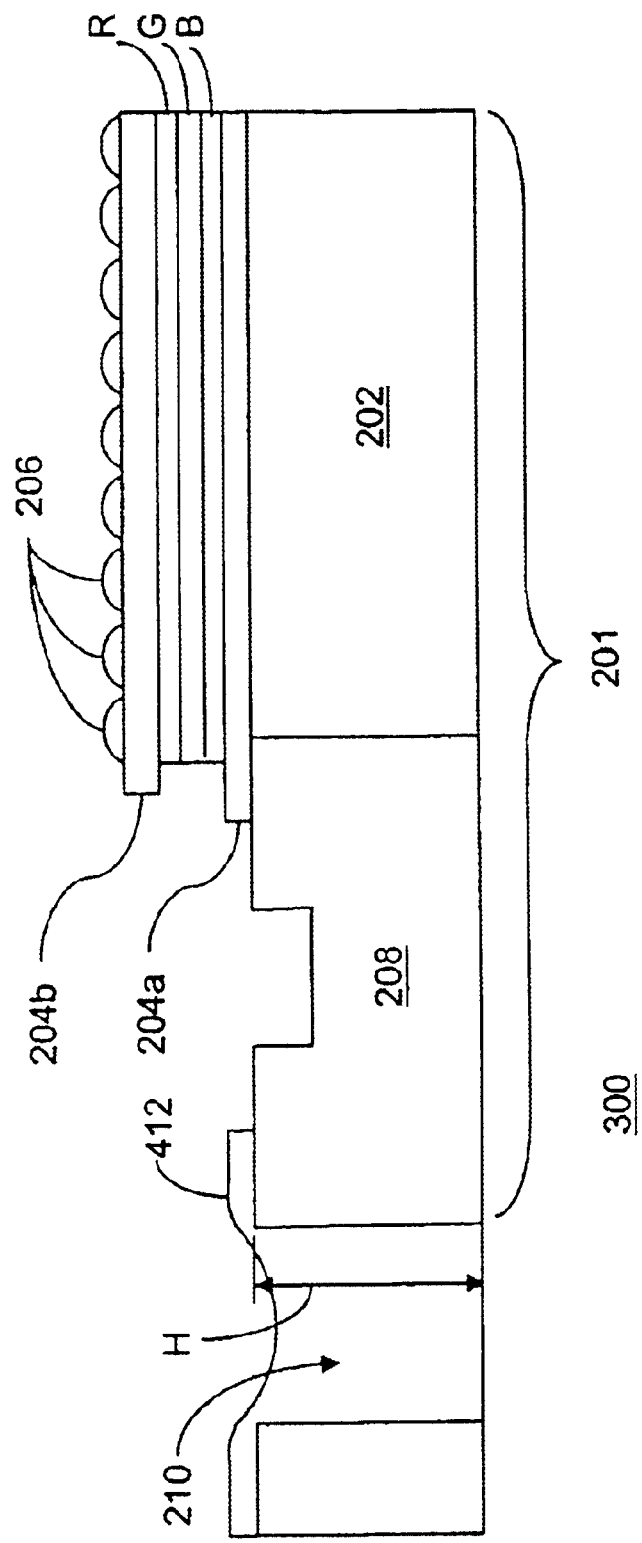
FIG. 4 is a cross sectional view showing an active region of a color filter formed processed using a different mask.

FIG. 4 is another example of a color filter 300, in which the resist 412 completely fills the scribe line, and continues above the substrate to about the height of the planarization layer 204a. In FIG. 4, the resist 412 is deposited all across the substrate, except in the immediate vicinity of the bond pads 209. This allows a greater degree of planarization, and is believed to promote formation of color resist layers B, G and R with more uniform thickness.

Figure 5:
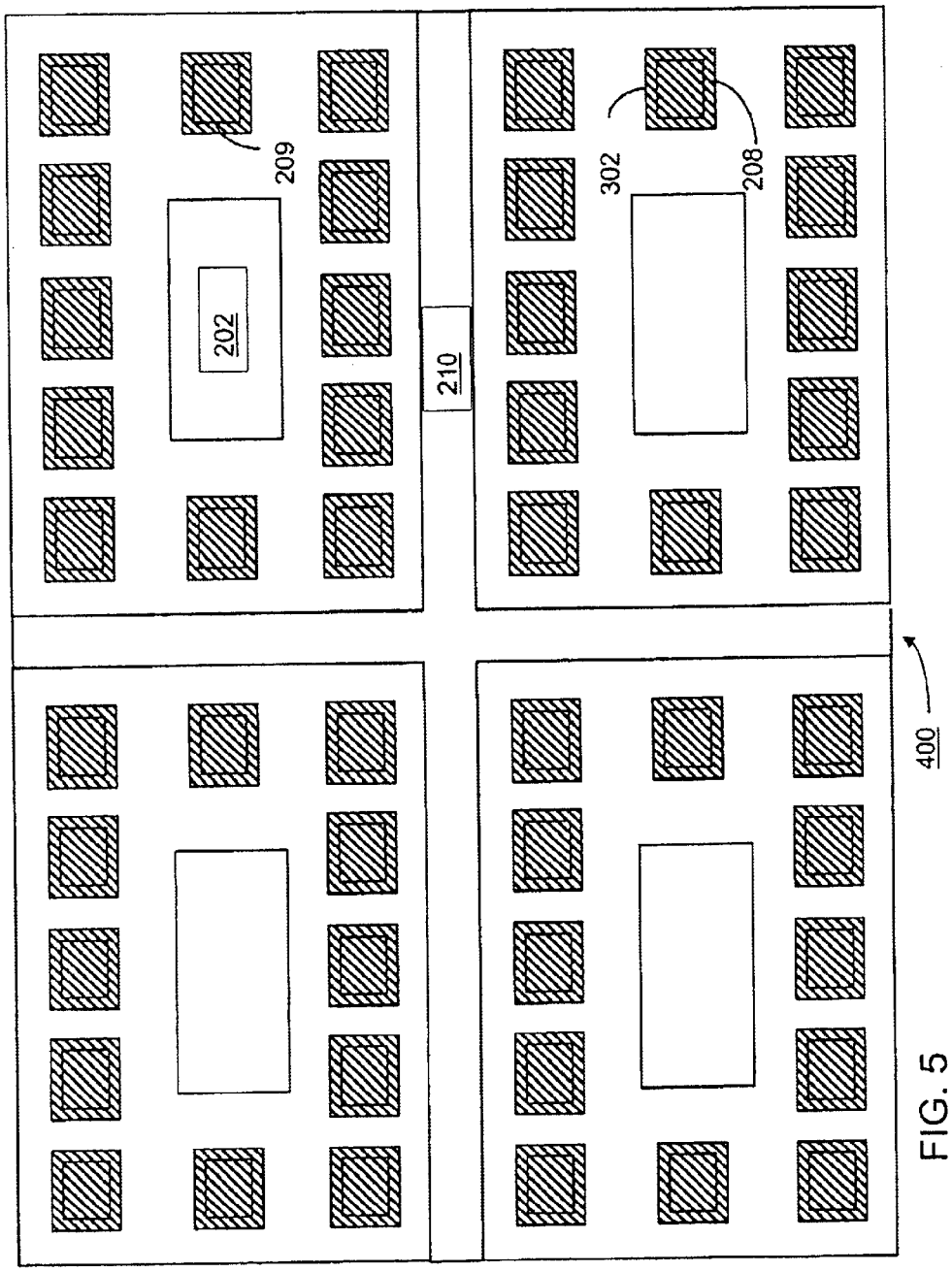
FIG. 5 is a plan view of a mask used to deposit resist on the color filter shown in FIG. 4.

FIG. 5 shows a mask 400 that can be used to perform the photoresist deposition step for depositing the resist 412 of FIG. 4. The exemplary mask 400 is clear throughout (assuming a negative resist is used), except within the square regions 302, which overlie the bond pad regions 208 and surround the bond pads 209. The mask is dark in regions 302. As a result, when the substrate is exposed through the mask 400, the resist is exposed everywhere except in the bond pad regions 302. After exposure, the portion of resist layer outside of the bond pad regions 302 becomes insoluble. The soluble portion of the resist in the bond pad regions 302 is removed using, for example, a chemical solution or dry plasma etch as described above, and the resist 412 remains in the scribe lines 210.

In other embodiments, (where a positive resist is used) the mask pattern is reversed, so that only the bond pad regions are exposed, and the exposed portion of resist layer becomes soluble. The portions of the resist outside the bond pad regions (including the resist in the scribe lines) remains insoluble.

The resist material 212, 412 may include any energy-sensitive material that can be formed on a substrate to create a pattern during integrated circuit manufacturing. Resist material 212 may contain, among many other ingredients, energy-sensitive polymers which change from soluble to insoluble after exposure to an energy source for a negative resist; and vice versa for positive resist. Resist material generally is tailored to a specific exposure source. In some embodiments, 248 nm resist material for deep ultraviolet (UV) at 248 nm or 193 nm resist material for deep ultraviolet (DUV) at 193 nm is employed. These are only examples, and other resists (including UV, DUV, X-ray and e-beam resists) may be used.

In some embodiments, the resist 312 is planarized, using a process such as etching. In some embodiments, the steps of applying the resist 312 and etching back the resist (to planarize the resist) are repeated a plurality of times, until a desired degree of planarization is achieved, and the step height in the scribe line is reduced to a desired amount.

In some embodiments, a mask such as that shown in FIG. 3 is used through one or more iterations to deposit photoresist in the scribe lines, followed by deposition using a mask such as that shown in FIG. 5 to deposit the resist above the surface of the substrate 201.

After the resist material 412 is deposited, a regular planarization mask (not shown) may be used to deposit photoresist on the active region 202 within the filter region, to form the planarization layer 204a. At least one color resist layer B, G, R is formed above the substrate within the at least one filter region while the hardened (insoluble) resist material remains in the scribe lines. Then the second planarization layer 204b is formed, and the microlens layer 206 is formed.

Once the resist 412 is deposited in the scribe line 210, the resist can be kept in the scribe lines permanently. The presence of the resist in the scribe lines does not interfere with subsequent processing operations (such as dicing), and does not interfere in any way with device performance. The resist 412 may optionally be removed from the scribe lines, if desired.

In an experiment, a 0.35 μm CMOS image sensor was formed. Prior to depositing the resist 412, the scribe line step height was 4.55 μm. After depositing a first layer of the resist using the mask shown in FIG. 5, the step height (i.e., the distance from the top of the resist to to the top of the substrate) was reduced to 2.6 μm, a 43% reduction. After depositing a second layer of resist using the same mask, the step height was reduced to 0.6 m. This represents an 87% reduction in the step height. The experiment showed that the yield (as measured by Cpk) greatly improved. Table 1 provides the results in terms of color non-uniformity. In Table 1, the 001A mask refers to a conventional mask used to form a planarization layer 204a in the active region. The 001B mask refers to the mask shown in FIG. 5. Thus, the columns designated "1X 001A mask only" refers to a conventional process. The mean and standard deviation refer to the color filter signal deviations.

TABLE 1

|  | 1X 001A mask only | | | 1X 001B mask combined with 001A | | | 2X 001B mask combined with 001A | | |
| --- | --- | --- | --- | --- | --- | --- | --- | --- | --- |
| Color | Mean | Std dev. | Cpk | Mean | Std dev. | Cpk | Mean | Std dev. | Cpk |
| Blue | 8.49% | 3.93% | −0.08 | 5.16% | 0.93% | 0.84% | 4.38% | 0.53% | 1.96 |
| Green | 6.45% | 2.84% | 0.12 | X | X | X | 4.13% | 0.45% | 2.5 |
| Red | 5.32% | 1.68% | 0.43 | X | X | X | 4.34% | 0.51% | 2.07 |

In Table 1, the columns designated, "1X 001B mask combined with 001A," refers to a process in which the mask 001B shown in FIG. 5 is used to deposit one layer of resist in the scribe lines (partially filling the scribe line), followed by deposition of the planarization layer 204a on the active region 202. The columns designated, "2X 001B mask combined with 001A," refers to a process in which the mask 001B shown in FIG. 5 is used to deposit two layers of resist in the scribe lines (partially filling the scribe line), followed by deposition of the planarization layer 204a on the active region 202. As a reference, a Cpk value of 0.5 corresponds to a yield of about 85%, and a Cpk value of 1.9 corresponds to a yield value near 100%.

Thus, by partially or completely filling the scribe line with resist before forming the color filter layers B, G and R, a more planar surface is provided, enhancing the uniformity of the subsequently formed color filter layers R, G and R.

Although an example is describe above in which two depositions of resist are used, any desired number of resist depositions may be used, depending on the depth of the scribe lines.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A color filter, comprising
a substrate having a plurality of scribe lines arranged to form at least one filter region surrounded by the scribe lines, the scribe lines at least partially filled with a resist material; and
at least one color resist layer formed above the substrate within the at least one filter region.

2. The color filter of claim 1, wherein the scribe lines have a depth and a height of the resist material is about 87% of the depth.

3. The color filter of claim 1, wherein the step height above the resist material in the scribe liens is about 0.6 µm.

4. A color filter formed by:
(a) providing a substrate having a plurality of scribe lines arranged to form at least one filter region surrounded by the scribe lines, the scribe lines having a step height;
(b) at least partially filling the scribe lines with a resist material to reduce the step height of the scribe lines; and
(c) forming at least one color resist layer within the at least one filter re on while the insoluble resist material remains in the scribe lines.

5. The color filter of claim 4, wherein the method further comprises keeping the resist material in the scribe lines permanently after step (b).

6. The color filter of claim 4, wherein step (b) includes:
forming a resist material layer above the substrate;
exposing the resist material layer using a mask configured so that insoluble resist material remains in the scribe lines so as to reduce the step height; and
removing a portion of the resist material layer outside of the scribe lines.

7. The color filter of claim 4, wherein step (b) includes reducing the step height by about 87%.

8. The color filter of claim 4, wherein step (b) includes reducing the step height to about 0.6 µm.

* * * * *